United States Patent [19]

Omoto et al.

[11] Patent Number: 5,043,788
[45] Date of Patent: Aug. 27, 1991

[54] SEMICONDUCTOR DEVICE WITH FUNCTIONAL PORTIONS HAVING DIFFERENT OPERATING VOLTAGES ON ONE SEMICONDUCTOR SUBSTRATE

[75] Inventors: Kayoko Omoto; Kazuaki Miyata, both of Hyogo, Japan

[73] Assignee: Mitsubishi Denki Kabushiki Kaisha, Tokyo, Japan

[21] Appl. No.: 396,501

[22] Filed: Aug. 21, 1989

[30] Foreign Application Priority Data

Aug. 26, 1988 [JP] Japan ................. 63-213208
Jun. 19, 1989 [JP] Japan ................. 1-157409

[51] Int. Cl.[5] ........................ H01L 27/02
[52] U.S. Cl. ........................ 357/42; 357/43; 357/48; 357/89
[58] Field of Search ............ 357/42, 43, 89, 41, 357/48

[56] References Cited

U.S. PATENT DOCUMENTS 4,258,379 3/1981 Watanabe et al. ............... 357/43
4,379,726 4/1983 Kumamaru et al. ............. 357/89
4,894,692 1/1990 Noda et al. .................... 357/41

FOREIGN PATENT DOCUMENTS 54-131887 10/1979 Japan ............................ 357/42
59-228766 12/1984 Japan .
60-47456 3/1985 Japan .
62-40758 2/1987 Japan ............................ 357/42
62-219555 9/1987 Japan ............................ 357/42

Primary Examiner—Andrew J. James
Assistant Examiner—Courtney A. Bowers
Attorney, Agent, or Firm—Lowe, Price, LeBlanc, Becker & Shur

[57] ABSTRACT

A single chip microcomputer as a semiconductor device comprises CMOS logic portion and a driver portion operating at a high voltage which can be connected to an external device. In the region of the CMOS logic portion, a P type well layer and an N type well layer are formed on a P type silicon substrate. An N type well layer is formed in the region constituting the driver portion. The junction depth of the N type well layer constituting the driver portion is made deeper than that of the N type well layer constituting the CMOS logic portion. A MOS transistor is formed in the region of each well layer in the CMOS logic portion. A MOS transistor whose drain breakdown voltage is increased is formed in the region of the N type well layer of the driver portion. The junction depth of the N type well layer is made deeper than that of the N type well layer constituting the CMOS logic portion at least below the drain region of this MOS transistor. The MOS transistor constituting the CMOS logic portion operates at a lower voltage while the MOS transistor constituting the driver portion operates at a higher voltage in order to drive external devices such as a fluorescent display tube connected thereto.

19 Claims, 12 Drawing Sheets

SEMICONDUCTOR DEVICE WITH FUNCTIONAL PORTIONS HAVING DIFFERENT OPERATING VOLTAGES ON ONE SEMICONDUCTOR SUBSTRATE

BACKGROUND OF THE INVENTION

1. Field of the Invention

The present invention relates generally to large scale integrated circuit devices, and more particularly to large scale integrated circuit devices having different functional portions that are operated by different operating voltages on one chip. The invention has particular application in the provision on a single substrate of a low voltage logic portion as well as a high voltage driver portion that is capable of driving a fluorescent display or the like. The invention further relates to a method of manufacturing such devices.

2. Description of the Background Art

Since the present invention provides the best effect when applied to a single chip microcomputer, the present invention will be hereinafter described with reference to the single chip microcomputer.

A single chip microcomputer has been well known. FIG. 8 is a block diagram showing one example of the entire structure of such conventional single chip microcomputer as a planar layout on one semiconductor chip.

Referring to FIG. 8, in the microcomputer 100, a logic portion consisting of a CPU (Central Processing Unit) 60, a ROM (Read Only Memory) 70 and a RAM (Random Access Memory) 80 for storing programs and data, and various peripheral control functions are integrated as a single chip by means of an internal bus such as a common bus 90. At the peripheral portions of the chip, an input/output interface portion I/O (Input & Output) 50 is provided as a driver portion, which is connected to drive various external devices. A signal inputted through the I/O 50 serving as a driver portion is transmitted to the CPU 60 which is a logic portion through a common bus 90, to be processed by reading program or data stored in the ROM 70 or RAM 80 or by writing data. The processed signal is transmitted to the I/O 50 which is the driver portion through the common bus 90 and drives external devices such as a fluorescent display tube connected thereto. FIG. 9 shows a cross section taken along the line IX—IX of FIG. 8.

FIG. 9 is a partial cross sectional view showing a main portion of the CMOS (Complementary Metal Oxide Semiconductor) logic portion constituting the CPU 60 and the driver portion constituting the I/O 50. As shown in the figure, N type well layers 2a and 2b and a P type well layer 3 are formed on a main surface of a P type silicon substrate 1. In the CMOS logic portion, the P type well layer 3 and the N type well layer 2a are formed adjacent to each other, and an oxide film 4 for isolation is formed on the main surface at the border therebetween. An N channel type MOS transistor is formed on the main surface of the region of the P type well layer, while a P channel type MOS transistor is formed on the main surface of the region of the N type well layer 2a. The N channel type MOS transistor comprises a gate electrode 5 and N type impurity diffused regions which will be the source and drain regions. The N type impurity diffused region has an LDD (Lightly Doped Drain) structure comprising an N+ impurity diffused region 6 having higher concentration and an N-impurity diffused region 9 having lower concentration.

The LDD structure is devised to prevent degradation of transconductance and time based change of the threshold voltage caused by hot carriers, derived from minimization of channel length of MOS field effect transistors. As shown in the figure, an N− impurity diffused region 9 is provided between the channel region and the drain region. By this structure, the electric filed of a drain pinch off region can be extended to the N− impurity diffused region 9, and therefore the maximum electric field can be reduced to prevent the generation of hot carriers. Since the position providing the maximum electric field is outer than the gate region, the generated hot carriers are not introduced to the gate insulating film. By virtue of this structure, the field effect transistor can be operated with shorter channel region and with higher supply voltage, compared with the conventional structure. In order to provide the LDD structure, a sidewall insulating film 10b is formed on the sidewall of the gate electrode 5 and a gate insulating film 10a is formed below the gate electrode 5. Meanwhile, the p channel MOS transistor formed on the region of the N type well layer 2a comprises a gate electrode and P+ impurity diffused regions 7 which are the P type impurity diffused regions formed spaced apart from each other to form the source and drain regions. In this manner, the logic portion has the CMOS structure and it operates at a low voltage of about 5V, for example.

The driver portion is formed adjacent to the CMOS logic portion structured as described above A P channel type MOS transistor constituting the driver portion is formed on a region of the N type well layer 2b formed on the main surface of the P type silicon substrate 1. The P channel type MOS transistor comprises a gate electrode 5 and P+ impurity diffused regions 7a and 7b which will be the source and drain regions. Since a signal having a voltage higher than 30V must be inputted/outputted to and from the P channel type MOS transistor in order to drive a fluorescent display tube and the like, for example, a thick gate insulating film 11a is provided between the P− impurity diffused region 7b on the drain side and the gate insulating film 10a formed below the gate electrode 5 in order to increase the drain breakdown voltage. A P− impurity diffused region 8 is provided below the thick gate insulating film 11a. Such a high voltage FET is disclosed in Japanese Patent Laying-Open No. 60-47456 (1985). The driver portion is structured as described above.

The N type well layer 2a constituting the CMOS logic portion and the N type well layer 2b constituting the driver portion are formed in the same process step. Therefore, the concentration of the N type impurities and the depths of diffusion of the N type impurity (junction depth) of these two N type well layers 2a and 2b are the same.

The operation of the P channel type MOS transistor formed in the driver portion will be described in the following with reference to FIG. 8. By applying a constant negative bias voltage to the gate electrode 5, the P channel MOS transistor is turned on. The P type silicon substrate 1, the N type well layer 2b and the P− impurity diffused region 7a on the source side are maintained at the potential of 0V. When a negative constant bias voltage is applied to the P− impurity diffused region 7b on the drain side, holes pass through a channel region formed directly below the gate insulating film 10a from the P+ diffused region 7a, through the P− impurity diffused region 8 to the P+ impurity diffused region 7b, whereby a current flows therethrough.

On this occasion, when the P type silicon substrate 1, the N type well layer 2b, P+ impurity diffused region 7a and the gate electrode 5 are kept at the potential of 0V and a negative bias voltage is applied to the P+ impurity diffused region 7b, then a depletion layer on the drain side extends to the P type silicon substrate 1, causing a punch through. The idea of this phenomenon which occurs at this time is disclosed in FIGS. 10A to 10C. FIG. 10A shows a state in which the bias voltage is 0V. FIG. 10B shows a state in which a voltage of −20V is applied as a negative bias voltage to the P+ impurity diffused region 7b. On this occasion, the depletion layer 71b on the drain side extends toward the P type silicon substrate 1. When a negative bias voltage of −30V is further applied to the P+ impurity diffused region 7b, the depletion layer 71b of the drain extends to the side of the P type silicon substrate 1, so that a punch through occurs between the P+ impurity diffused region 7b as the drain region, the N type well layer 2b and the P type silicon substrate 1. Namely, the drain breakdown voltage of the P channel type MOS transistor constituting the driver portion formed on the region of the N type well layer 2b is determined by the junction depth and the N type impurity concentration of the N type well layer 2b.

In a conventional semiconductor device having a CMOS logic portion and a driver portion, the well layer constituting the CMOS logic portion and the well layer constituting the driver portion are formed in the same process step, so that they have the same junction depth and the same impurity concentration. A MOS transistor requiring high drain breakdown voltage is formed on a region of the well layer constituting the driver portion. However, if the junction depths of the well layer becomes shallow, the drain breakdown voltage of the MOS transistor formed in the region of the well layer is decreased. Therefore, the MOS transistor formed in the driver portion must be formed in a region of a well layer which has deeper junction depth.

Meanwhile, the CMOS logic portion formed in a region of the well layer having the same junction depth as the driver portion must be miniaturized, since the elements must be highly integrated. In order to meet this demand of miniaturization, element isolating regions must be reduced. Therefore, as the degree of integration becomes higher, that is, as the device has come to be miniaturized, the junction depth of the well layer in the region on which semiconductor devices constituting the logic portion are formed tends to be shallower in order to realize small isolation region for high degree of integration.

Therefore, the formation of the logic portion and the driver portion in the well layers having the same junction depth is disadvantageous in that the junction depths of the well layer become shallower as the logic portion has come to be miniaturized, causing decrease of the drain breakdown voltage of the MOS transistor formed in the driver portion, which leads to a failure of provision of the necessary drain breakdown voltage.

SUMMARY OF THE INVENTION

The present invention was made to solve the above described problem and its object is to provide a semiconductor device capable of meeting two inconsistent demands of miniaturization and of increasing breakdown voltage on one semiconductor substrate.

Another object of the present invention is to provide a semiconductor substrate comprising a miniaturized logic portion and a driver portion having high operational voltage which can be connected to a device having high driving voltage in one semiconductor substrate.

A further object of the present invention is to provide a semiconductor device having a miniaturized CMOS logic portion and a MOS transistor operating at a high voltage in the same semiconductor substrate.

A still further object of the present invention is to provide a method for manufacturing a semiconductor device which meets two inconsistent demands of miniaturization and of increasing breakdown voltage on one semiconductor substrate.

The semiconductor device in accordance with the present invention comprises a semiconductor substrate, a first semiconductor region and a second semiconductor region. The semiconductor substrate has a main surface and is of a first conductivity type. The first semiconductor region is formed on the main surface of the semiconductor substrate and it is of a second conductivity type which is opposite to that of the semiconductor substrate in which at least a semiconductor element is formed. The second semiconductor region is formed on the main surface of the semiconductor substrate and has the second conductivity type in which at least a semiconductor element is formed. At least a portion of the second semiconductor region has the junction depth deeper than that of the first semiconductor region.

According to a preferred embodiment of the present invention, a first field effect type semiconductor element is formed in the first semiconductor region and a second field effect type semiconductor element is formed in the second semiconductor region. The operational voltage of the second field effect type semiconductor element is higher than that of the first field effect type semiconductor element. The first field effect type semiconductor element comprises an impurity region of the first conductivity type formed in the first semiconductor region, and the second field effect type semiconductor element comprises an impurity region of the first conductivity type formed in the second semiconductor region. The junction depth of the second semiconductor region is preferably deeper than that of the first semiconductor region at least below only the impurity region of the first conductivity type constituting one electrode of the second field effect type semiconductor element.

In accordance with the method of manufacturing a semiconductor device in accordance with the present invention, impurities of a second conductivity type are selectively introduced to a first region of a main surface of a semiconductor substrate having a first conductivity type. The impurities of the second conductivity type are selectively introduced to the first region and to a second region which is different from the first region. The first and second regions are thermally processed to diffuse the introduced impurities of the second conductivity type, whereby first and second semiconductor regions of the second conductivity type having different junction depths are formed.

In accordance with the preferred embodiment of the method of manufacturing the semiconductor device of the present invention, impurities of the first conductivity type are selectively introduced to a third region adjacent to the second region. The step of forming the first and second semiconductor regions of the second conductivity type having different junction depth comprises the step of forming the third semiconductor region of the first conductivity type by thermally processing the third region to diffuse the introduced impurities of the first conductivity type.

In the present invention, one of the two semiconductor regions having the same conductivity type on which semiconductor elements are respectively formed has deeper junction depth than the other. Therefore, a field effect type semiconductor element having high drain breakdown voltage can be formed on the semiconductor region a portion of which having deeper junction depth. Highly integrated semiconductor element can be formed on the semiconductor region a portion of which having shallower junction depth.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be hereinafter described with reference to the figures.

Figure 1:
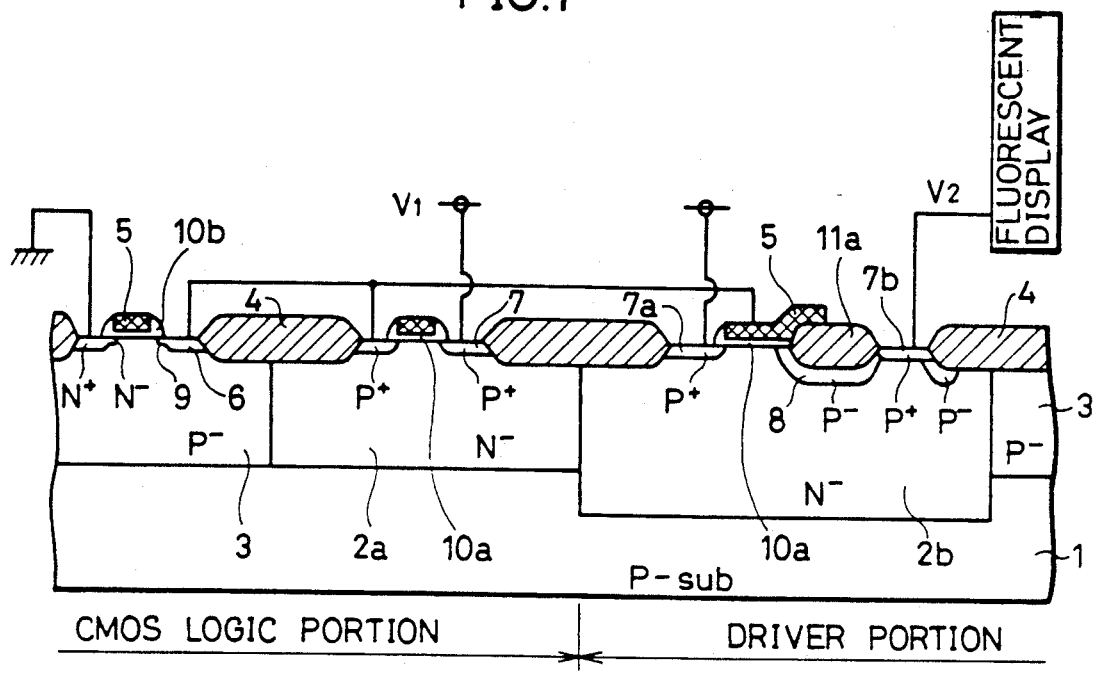
FIG. 1 is a partial cross sectional view showing one embodiment of a semiconductor device in accordance with the present invention.
Figure 8:
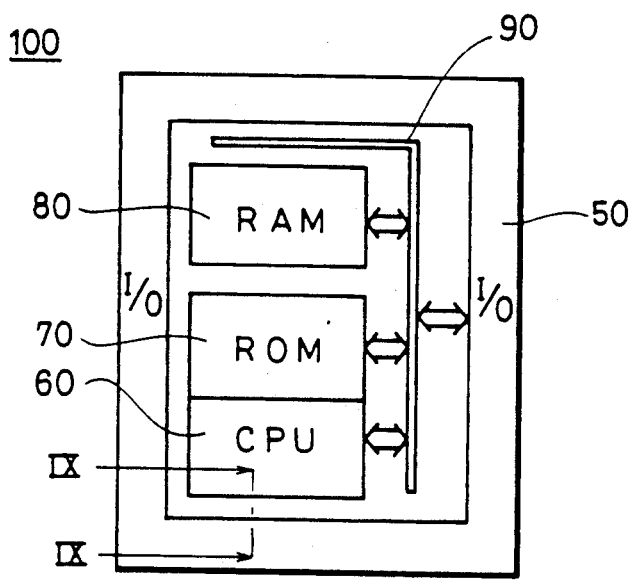
FIG. 8 is a block diagram showing a whole structure of a conventional single chip microcomputer.
Figure 9:
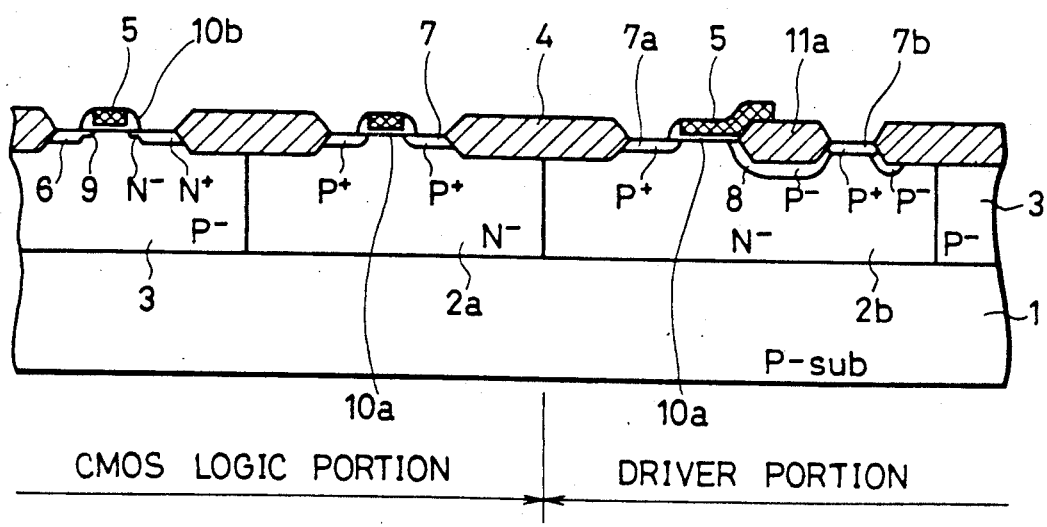
FIG. 9 is a partial cross sectional view showing a cross section taken along the line IX—IX of FIG. 8.
Figure 10A:
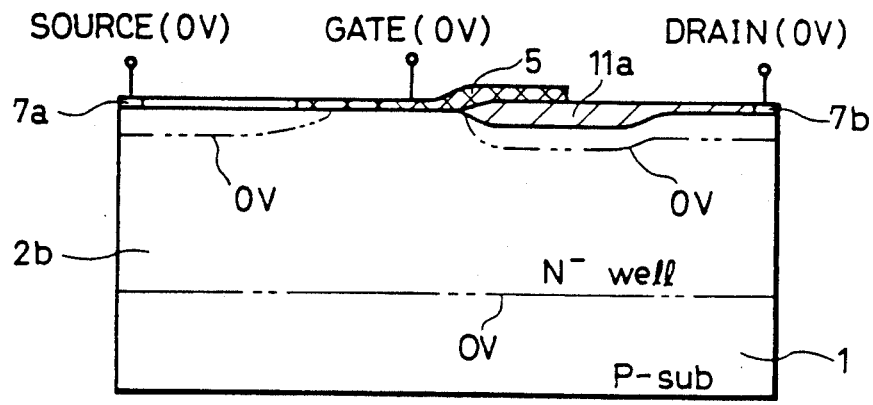
FIGS. 10A, 10B and 10C are partial cross sectional views showing the idea of punch through occurred in an MOS transistor formed at a conventional driver portion.
Figure 10B:
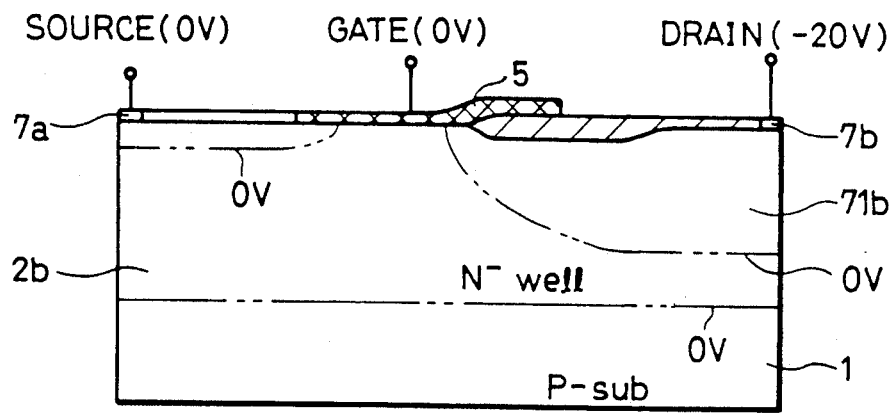
Figure 10C:
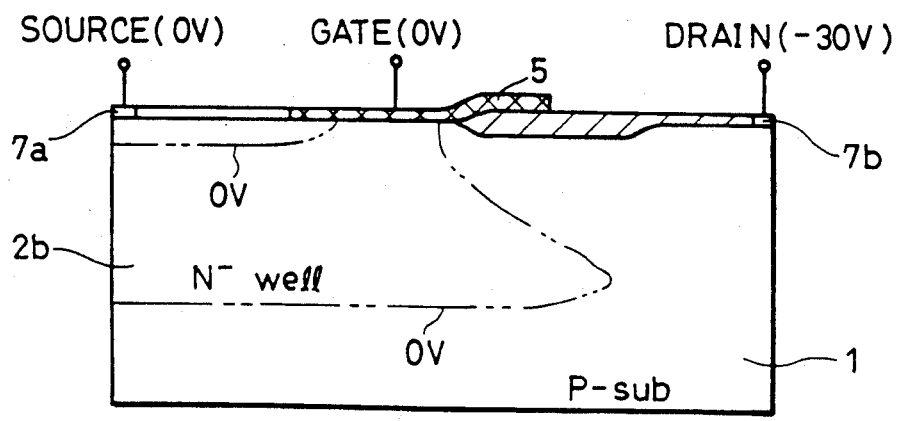

FIG. 1 is a partial cross sectional view showing a cross section taken along the line IX—IX of FIG. 8 as an example of a semiconductor device having two semiconductor regions in accordance with the present invention.

Referring to FIG. 1, N type well layers 2a and 2b and a P type well layer 3 are formed on a main surface of a P type silicon substrate 1. In a CMOS logic portion, the N type well layer 2a and the P type well layer 3 are formed adjacent to each other, and an oxide film 4 for isolation is formed on the main surface at the border therebetween. An N channel type MOS transistor is formed on the main surface of the P type well layer 3. The N channel MOS transistor is constituted by a gate electrode 5 and N type impurity diffused regions formed spaced apart from each other below the gate electrode 5 which are to be the source and drain regions. The N type impurity regions have an LDD structure including N+ impurity diffused region 6 having higher concentration and N− impurity diffused region 9 having lower concentration. In order to form the LDD structure, sidewall insulating films 10b is formed on the sidewalls of the gate electrode 5 and a gate insulating film 10a is formed below the gate electrode 5. Meanwhile, a P channel type MOS transistor is formed in the region of the N type well layer 2a. The P channel type MOS transistor is constituted by a gate electrode 5 and P+ impurity diffused regions 7 formed spaced apart from each other below the gate electrode which are to be the source and drain regions.

In this manner, the CMOS logic portion having two well layers of the same junction depth, i.e. the P type well layer 3 and the N type well layer 2a is formed.

The driver portion is formed adjacent to the CMOS logic portion structured as described above. The driver portion is formed in the region of the N type well layer 2b whose junction depth is deeper than that of N type well layer 2a constituting the CMOS logic portion. The junction depths of the N type well layer 2b is about 6.5 $\mu$m, for example, and the junction depths of the N type well layer 2a constituting the CMOS logic portion is about 5 $\mu$m. The junction depths of the N type well layer 2b should be as deep as possible. The junction depths of the N type well layer 2b constituting the driver portion is defined by the drain breakdown voltage which is necessary for MOS transistor formed in that region. A surface impurity concentration of the N type well layer 2b constituting the driver portion may preferably be substantially the same as that of the N type well layer 2a constituting the CMOS logic portion. For example, the surface impurity concentration of the N type well layer 2b should preferably be about $1 \times 10^{16}/cm^3$.

A P channel type MOS transistor having a structure suitable for increasing the drain breakdown voltage is formed on the main surface of the region of the N type well layer 2b constituting the driver portion. The P channel type MOS transistor comprises a gate electrode 5, and a P+ impurity diffused region 7a serving as the source region and a P− impurity diffused region 7b serving as the drain region formed spaced apart from each other below the gate electrode 5. A thick gate insulating film 11a is formed between a gate insulating film 10a formed below the gate electrode 5 and the P− impurity diffused region 7b serving as the drain region, and a P− impurity diffused region 8 is formed therebelow. The breakdown voltage is increased by increasing the thickness of the gate insulating film on the side of the drain region.

In this manner, the N type well layer 2a having shallow junction depth is formed in the CMOS logic portion which should be miniaturized, while the N type well layer 2b having deeper junction depth is formed in the driver portion which should have higher drain breakdown voltage.

As shown in FIG. 1, when we represent the operation voltage of the MOS transistor formed at the CMOS logic portion shown in FIG. 1 as $V_1$, the operation voltage of the MOS transistor formed at the driver portion is $V_2$ which is higher than $V_1$. A fluorescent display tube driven by the high voltage $V_2$ is connected to the P+ impurity diffused region 7b serving as the drain region of the P channel type MOS transistor constituting the driver portion. A supply voltage having the lower voltage $V_1$ is connected to the P+ impurity region 7 of the P channel type MOS transistor constituting the CMOS logic portion.

Figure 2:
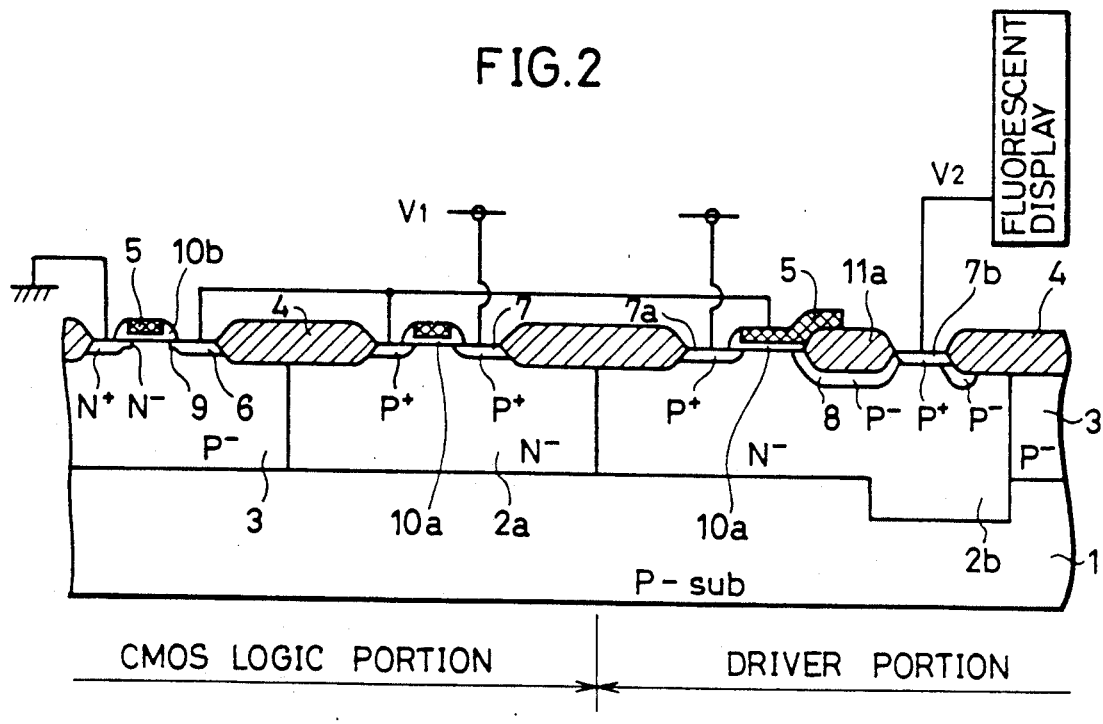
FIG. 2 is a partial cross sectional view showing another embodiment of the semiconductor device in accordance with the present invention.

FIG. 2 is a partial cross sectional view showing another embodiment of the semiconductor device in accordance with the present invention. Compared with FIG. 1, the junction depth of the N type well layer 2b is made deeper only below the P+ impurity diffused region 7b serving as the drain region of the P channel type MOS transistor constituting the driver portion. The junction depth of the well layer may be made deeper only below the drain region MOS transistor at which the drain breakdown voltage must be increased. By doing so, the junction depth of the portion of the N type well layer 2b at the driver portion adjacent to the N type well layer 2a constituting the CMOS logic portion can be made shallower. Therefore, the region occupied by the isolation oxide film 4 formed on the boundary region between the N type well layer 2a constituting the CMOS logic portion and the N type well layer 2b constituting the driver portion can be made small.

The method of manufacturing the semiconductor device in accordance with the present invention will be described in the following. FIGS. 3A to 3M show the cross section of FIG. 1 in the order of the manufacturing process. The method of manufacturing the semiconductor device having such a cross section as shown in FIG. 1 will be described in the following.

Figure 3A:
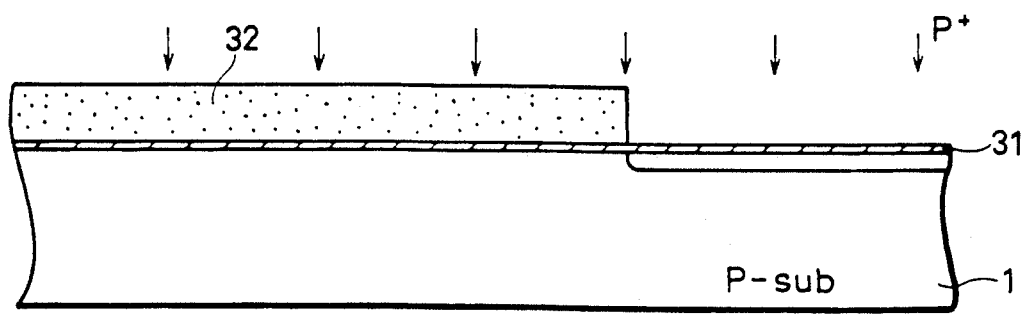
FIGS. 3A, 3B, 3C, 3D, 3E, 3F, 3G, 3H, 3I, 3J, 3K, 3L and 3M are partial cross sectional views showing in this order the manufacturing steps of the semiconductor device as shown in FIG. 1.

First, as shown in FIG. 3A, a silicon oxide film 31 is formed on a P type silicon substrate 1 by thermal oxidation, chemical vapor deposition method or the like. A resist film 32 corresponding to a prescribed pattern is formed on the silicon oxide film 31. Phosphorus ions which are N type impurity ions are implanted onto the P type silicon substrate 1 using the resist film 32 as a mask. The phosphorus ions are implanted at this time with the accelerating voltage being 150 keV and the dosage being $1 \times 10^{12}$ cm$^{-2}$, for example.

Figure 3B:
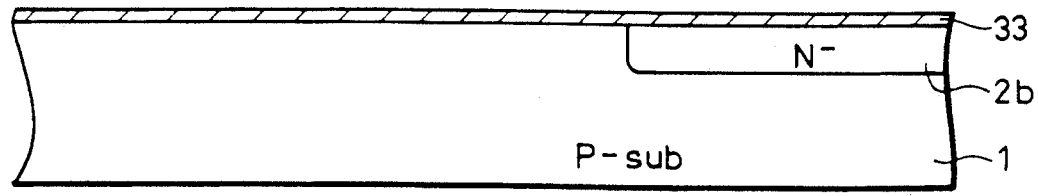

Thereafter, as shown in FIG. 3B, the resist film 33 is removed and the implanted phosphorus ions are thermally diffused by thermal oxidation and thermal processing carried out on the P type silicon substrate 1. The driving condition on this occasion is, for example, one hour and thirty minutes in an oxide atmosphere at the temperature of 1050° C. and 6 hours in a nitride atmosphere at the temperature of 1180° C. As a result, an N type well layer 2b is formed on the P type silicon substrate 1 and a thermal oxide film 33 is formed thereon.

Figure 3C:
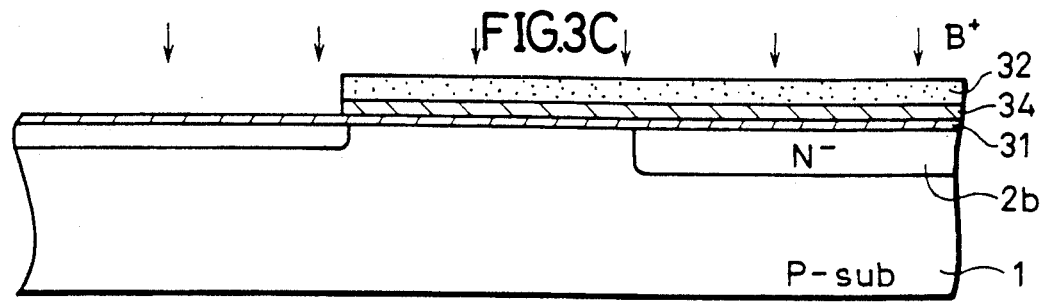

Thereafter, as shown in FIG. 3C, the thermal oxide film 33 is removed, a silicon oxide film 31 is formed by thermal oxidation or chemical vapor deposition method or the like, and a silicon nitride film 34 is formed thereon. A resist film 32 is formed corresponding to a prescribed pattern on the silicon nitride film 34 and the silicon nitride film 34 is selectively removed. Boron ions which are P type impurity ions are implanted onto the P type silicon substrate 1 using the resist film 32 and the silicon nitride film 34 formed in accordance with the prescribed pattern as masks.

Figure 3D:
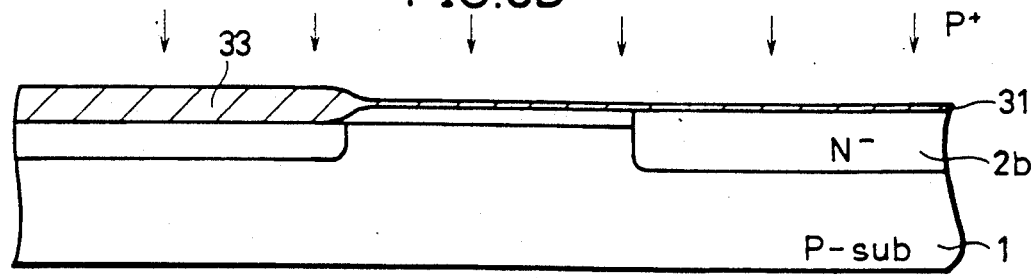

As shown in FIG. 3D, the resist film 32 are removed and, thereafter, thermal processing and thermal oxidation are carried out. By doing so, the implanted boron ions and the phosphorus ions implanted in the aforementioned process are thermally diffused. On this occasion, a thick thermal oxide film 33 is formed on that region in which the boron ions are implanted. Thereafter, the silicon nitride film 34 is removed. Phosphorus ions which are the N type impurity ions are implanted using the thermal oxide film 33 as a mask. The condition of implantation on this occasion is, for example, an accelerating voltage of 150 keV and dosage of $3.0 \times 10^{12}$/cm$^2$.

Figure 3E:
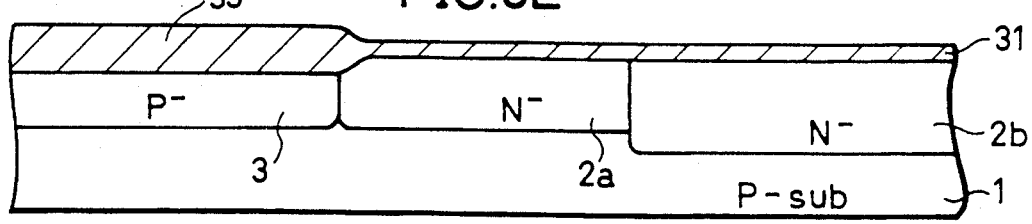

Thereafter, as shown in FIG. 3E, thermal oxidation and thermal processing are carried out to thermally diffuse the implanted boron ions and phosphorus ions. The driving condition on this occasion is 1.5 hours in an oxide atmosphere at the temperature of 1050° C. and 6 hours in a nitride atmosphere at the temperature of 1180° C, for example. In this manner, the P type well layer 3 and the N type well layer 2a constituting the logic portion are formed to have the same junction depth of about 5.0 $\mu$m, for example. Therefore, the junction depth of the well layers constituting the CMOS logic portion is shallower by about 1.5 $\mu$m than the junction depth of the N type well layer 2b constituting the driver portion. On this occasion, the surface concentration of the N type well layer 2a formed by once implanting ions and of the N type well layer 2b formed by implanting ions twice with different dosages are made uniform by the simultaneous thermal processing. Consequently, the threshold voltages of the MOS transistors formed on the respective N type well layers are made approximately the same.

Figure 3F:
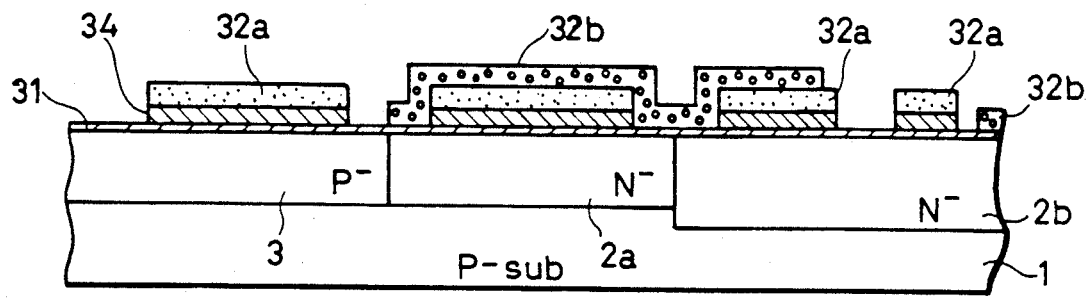

As shown in FIG. 3F, the thermal oxide film 33 is removed and a silicon oxide film 31 is formed on the entire surface by thermal oxidation, chemical vapor deposition method or the like. A silicon nitride film 34 and a resist film 32a corresponding to prescribed patterns are formed to cover only the element forming regions on the silicon oxide film 31. A resist film 32b is formed on the resist film 32a and the silicon oxide film 31 so that only that region on which a channel stopper region and the like are to be formed is exposed.

Figure 3G:
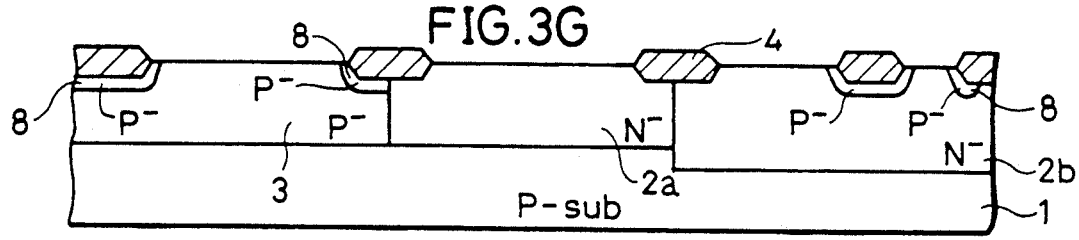

As shown in FIG. 3G, P type impurity ions such as boron ions are implanted by using the resist film 32b as a mask to form a P– impurity diffused region 8. After the resist films 32a and 32b is removed, thermal oxidation is carried out to form oxide films 4 for isolation spaced apart from each other. Thereafter, the silicon nitride film 34 and the silicon oxide film 31 are removed.

Figure 3H:
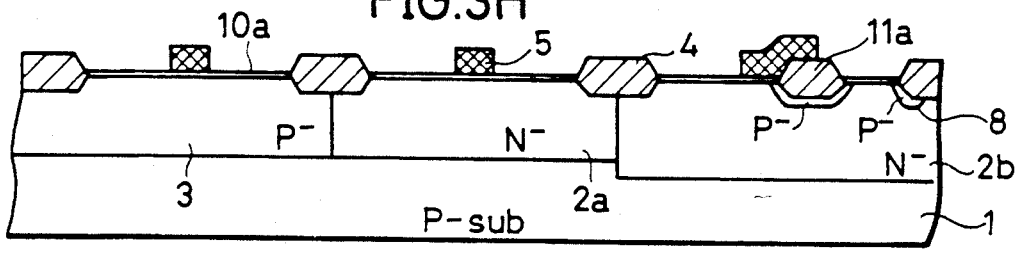

Referring to FIG. 3H, a gate insulating film 10a is formed and gate electrodes 5 are formed spaced apart from each other by a conductive layer such as polysilicon or the like.

Figure 3I:
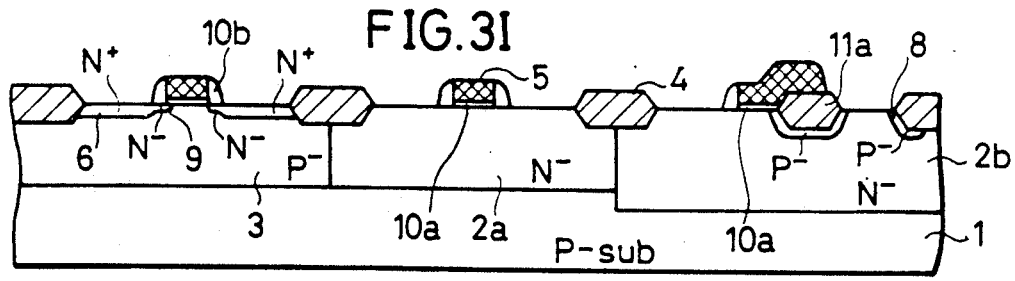

Thereafter, as shown in FIG. 3I, N type impurity ions such as phosphorus ions are implanted into a region of the P type well layer 3 using the gate electrodes 5 as masks to form the N– impurity diffused regions 9 having lower concentration which are to be the source and drain regions of the N channel type MOS transistor. On this occasion, sidewall insulating films 10b are formed on both sidewalls of the gate electrode 5 and N type impurity ions are further implanted to the region of the P type well layer 3 to provide N– impurity diffused region 6 having higher concentration. In this manner, the N channel type MOS transistor formed in a region of the P type well layer 3 is formed to have the LDD (Lightly Doped Drain) structure.

Figure 3J:
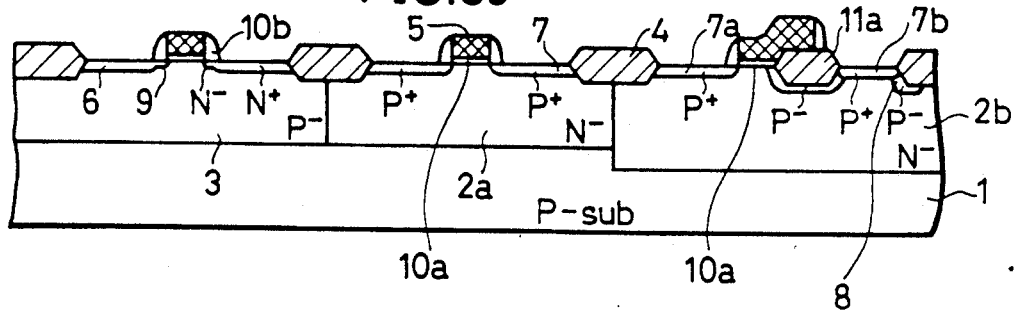

Referring to FIG. 3J, P type impurity ions such as boron ions are implanted on the regions of the N type well layers 2a and 2b using the gate electrode 5 and sidewall insulating films 10b as a mask. Consequently, P+ impurity diffused region 7 which are to be source and drain regions are formed in the region of the N type well layer 2a while P+ impurity diffused region 7a serving as the source region and the P+ impurity region 7b serving as the drain region are formed in the region of the N type well layer 2b.

Figure 3K:
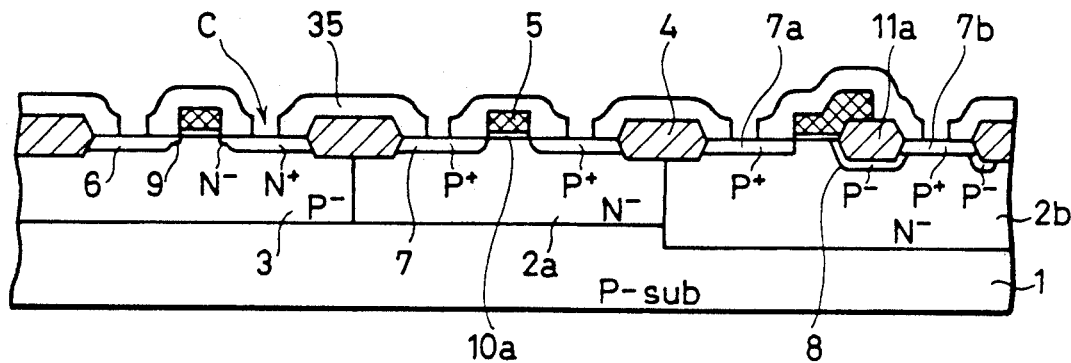

As shown in FIG. 3K, an interlayer insulating film 35 formed of an oxide film or the like is deposited on the entire surface and contact holes C are formed to provide electrical contact between each of the impurity diffused regions.

Figure 3L:
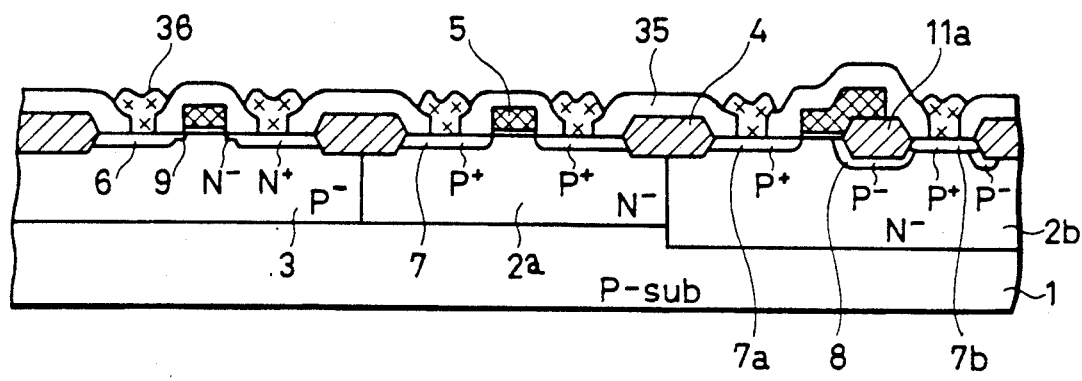

As shown in FIG. 3L, aluminum wiring is provided by the formation of Al/Si film 36 on the contact hole C.

Figure 3M:
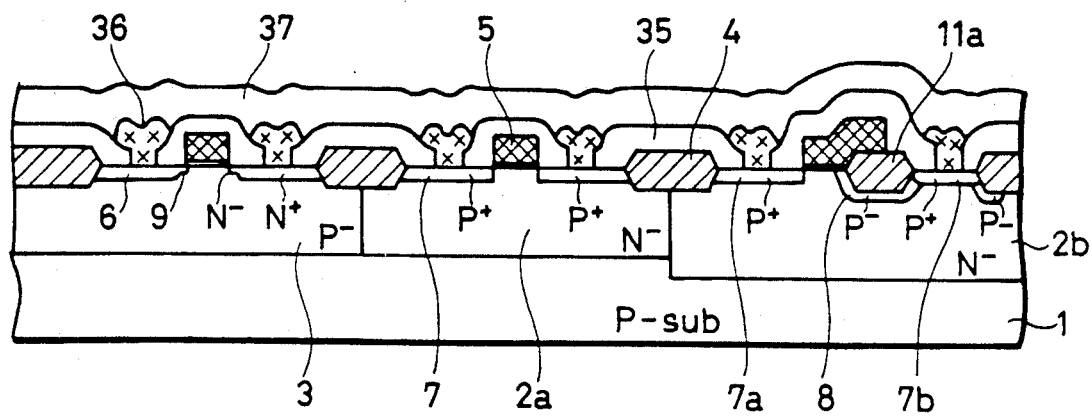

Finally, as shown in FIG. 3M, a surface protecting film 37 is deposited on the entire surface.

A semiconductor device comprising semiconductor region of the same conductivity type having different junction depth, that is, a semiconductor device comprising N type well layers 2a and 2b having different junction depth formed in a P type silicon substrate in this example, can be manufactured in this manner.

Figure 4A:
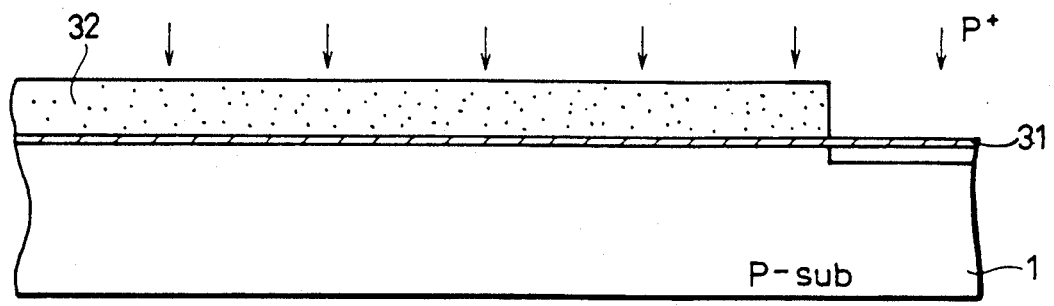
FIGS. 4A, 4B, 4C, 4D, 4E, 4F, 4G, 4H, 4I, 4J, 4K, 4L and 4M are partial cross sectional views showing, in this order, the steps of manufacturing the semiconductor device shown in FIG. 2.
Figure 4B:
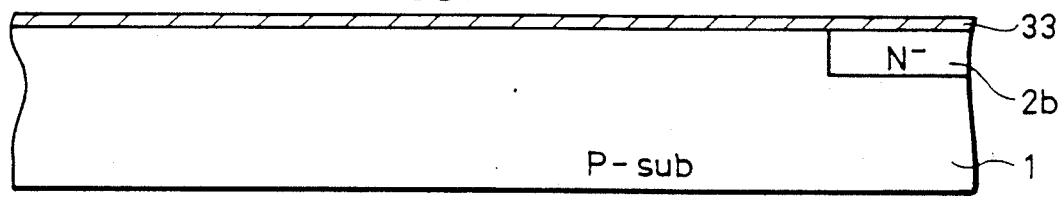
Figure 4C:
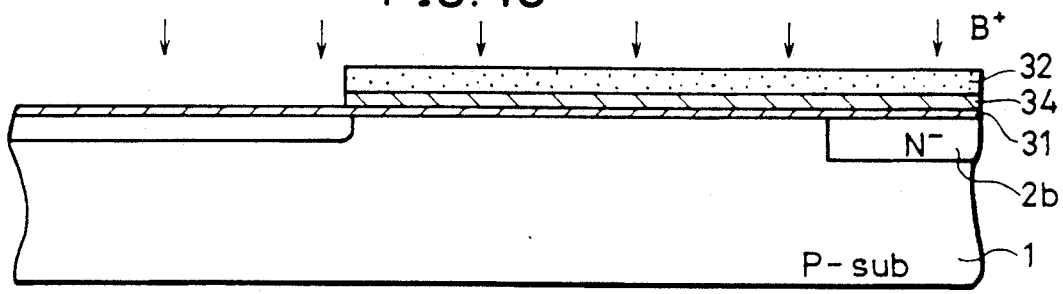
Figure 4D:
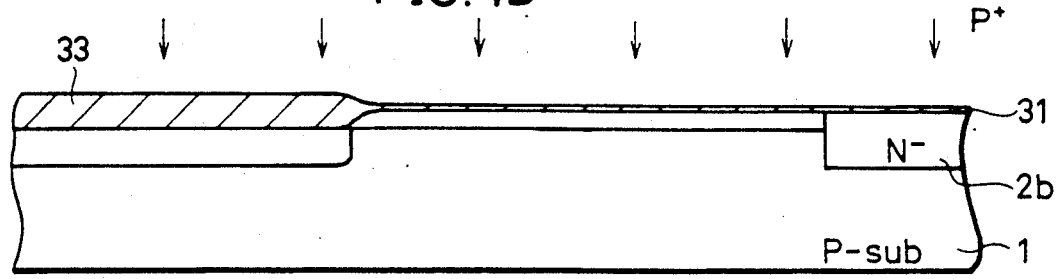
Figure 4E:
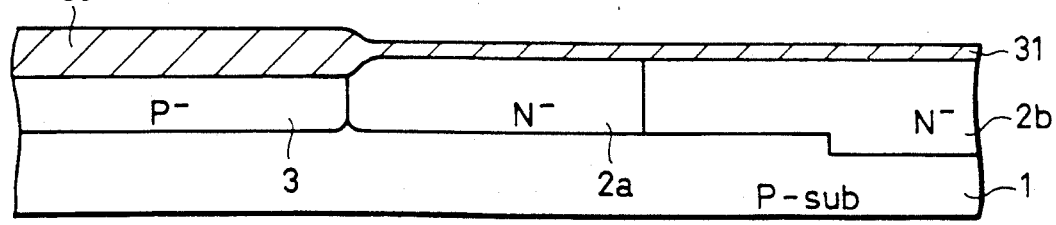
Figure 4F:
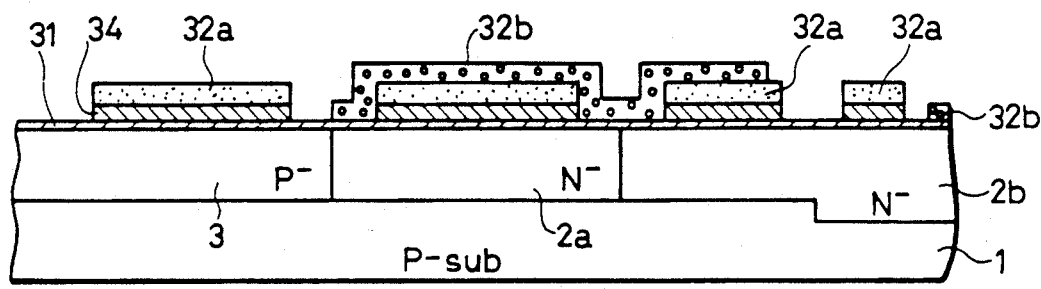
Figure 4G:
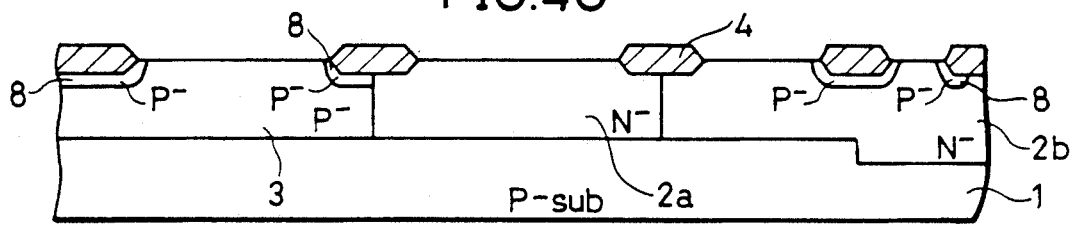
Figure 4H:
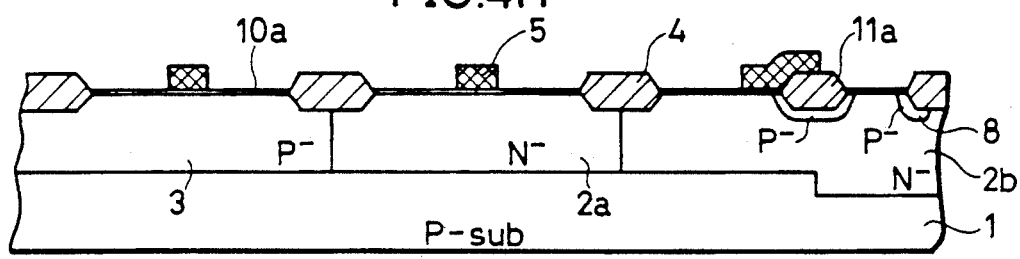
Figure 4I:
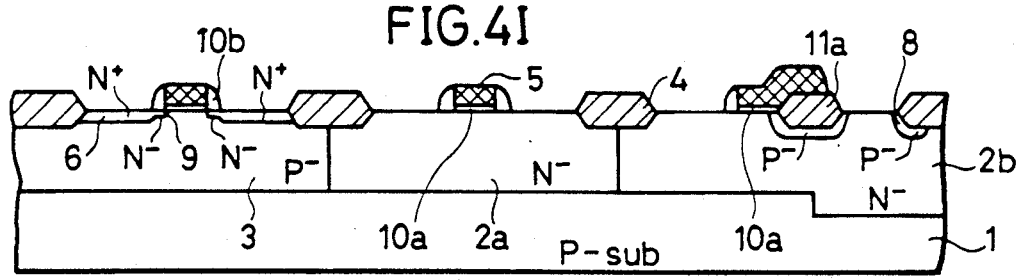
Figure 4J:
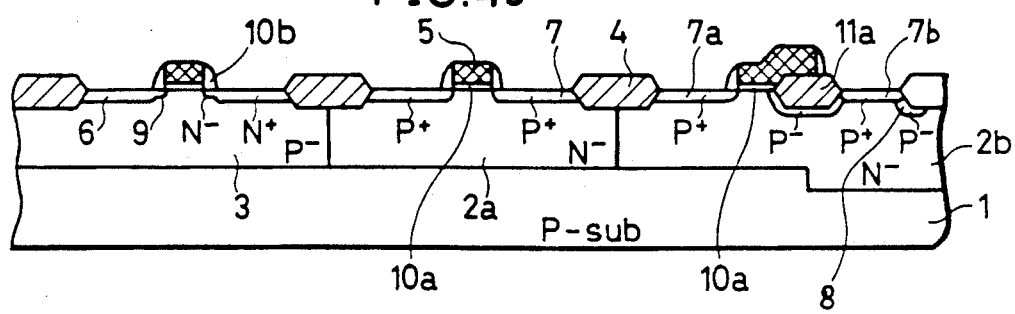
Figure 4K:
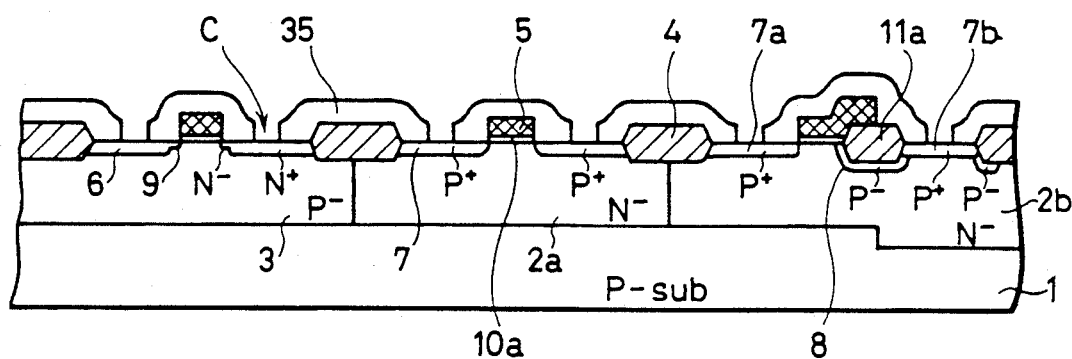
Figure 4L:
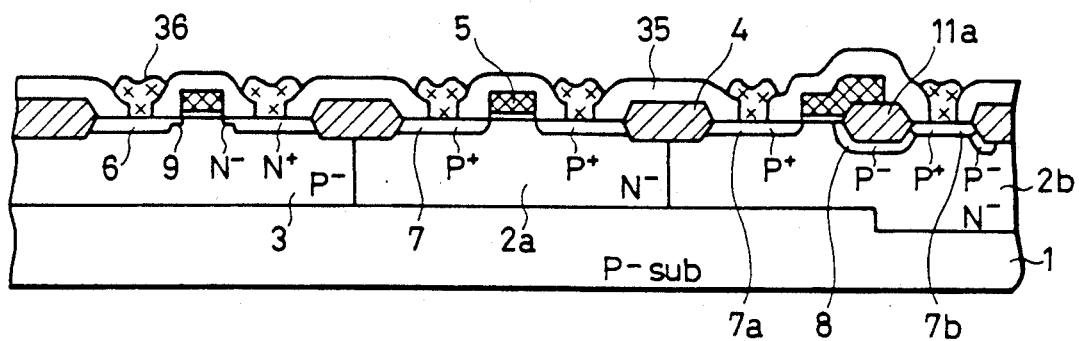
Figure 4M:
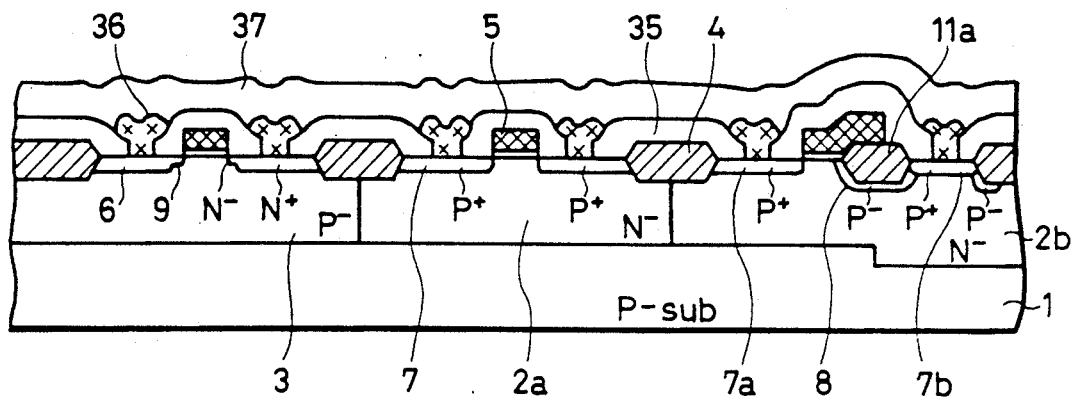

FIGS. 4A to 4M show, in this order, the process steps for forming the cross section shown in FIG. 2. The method of manufacturing the semiconductor device of FIG. 2 is the same as that shown in FIGS. 3A to 3M except that the position for forming the mask constituted by the resist film 32 in FIG. 4A is different from the position shown in FIG. 3A.

Conditions of ion implantation to form the aforementioned N type well layers having different junction depth will be described in the following. FIGS. 5A to 5E are graphs, obtained experimentally, showing relations between the phosphorus dosage, the drain breakdown voltage, junction depth and the well concentration to form the N type well layer. The line plotted by black points represents the results of thermal diffusion under the driving condition of two hours in an oxide atmosphere at the temperature of 1100° C. and thereafter 9 hours in a nitride atmosphere at the temperature of 1180° C. The line plotted by a white point represents the result of thermal diffusion under the driving conditions of 1.5 hours in an oxide atmosphere at the temperature of 1050° C. and thereafter 6 hours in a nitride atmosphere at the temperature of 1080° C. The accelerating voltage of ion implantation is 150 keV in both cases.

Figure 5A:
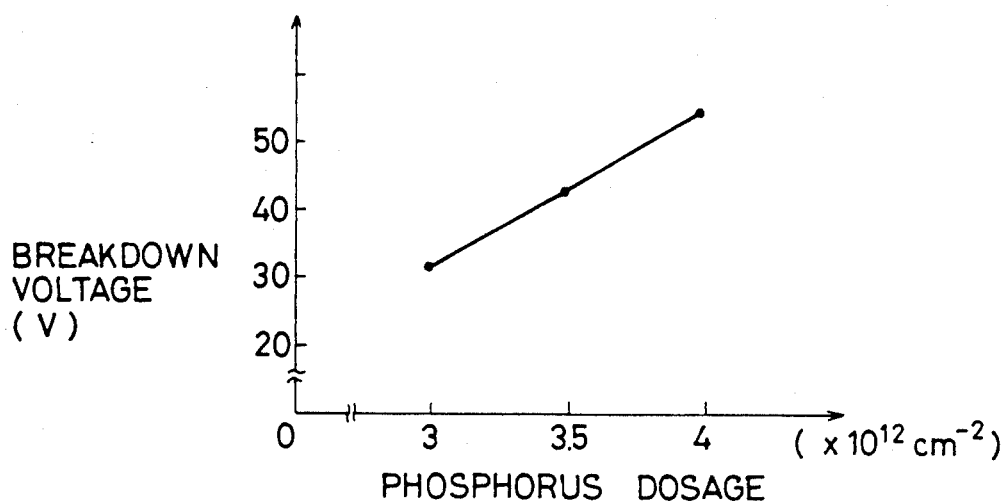
FIG. 5A, 5B, 5C, 5D and 5E are graphs showing relations between the dosage of phosphorus for forming the N type well layer, junction depths, drain breakdown voltage and the well concentration.
Figure 5B:
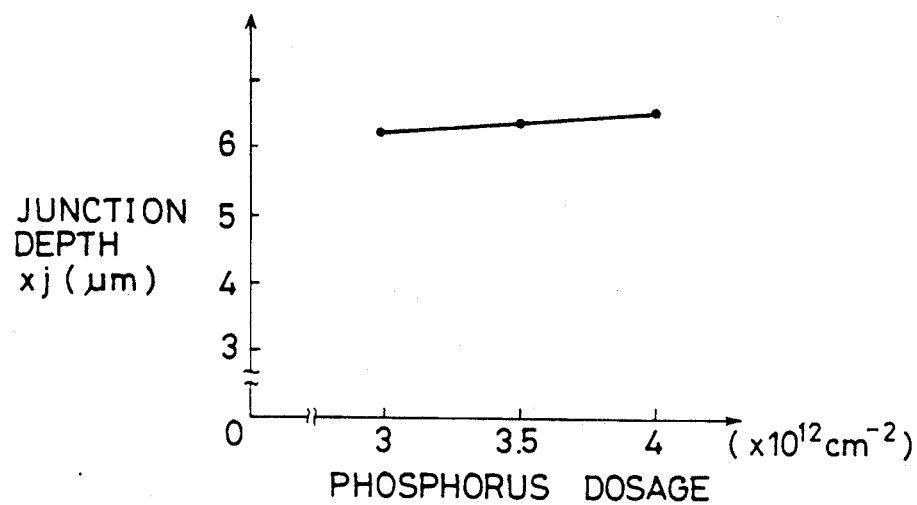
Figure 5C:
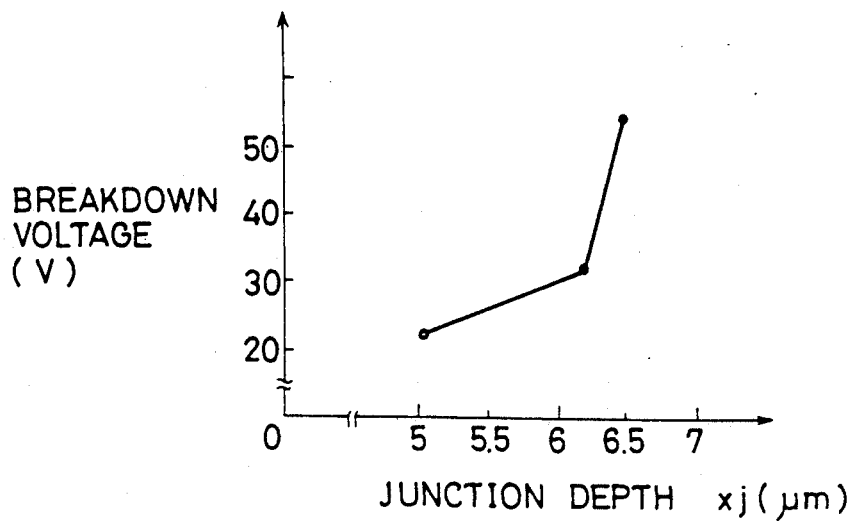

Referring to FIG. 5A, the drain breakdown voltage of the MOS transistor formed in the phosphorus implanted region increases as the amount of phosphorus ions implanted therein is increased. Referring to FIG. 5B, the junction depth $x_j$ of the implanted region becomes deeper as the amount of phosphorus is increased. Further, as shown in FIG. 5C, by increasing the junction depth $x_j$, the drain breakdown voltage of the MOS transistor formed in that region can be increased. Therefore, by setting the phosphorus dosage and other driving conditions after implantation at prescribed values, the drain breakdown voltage of the MOS transistor formed in that regions can be set at a prescribed desired voltage. In this case, the relation between the breakdown voltage and the junction depth $x_j$ is such that the breakdown voltage is in the range of 30 to 55V and the junction depth $x_j$ is in the range of 6.0 to 6.5 μm.

Figure 5D:
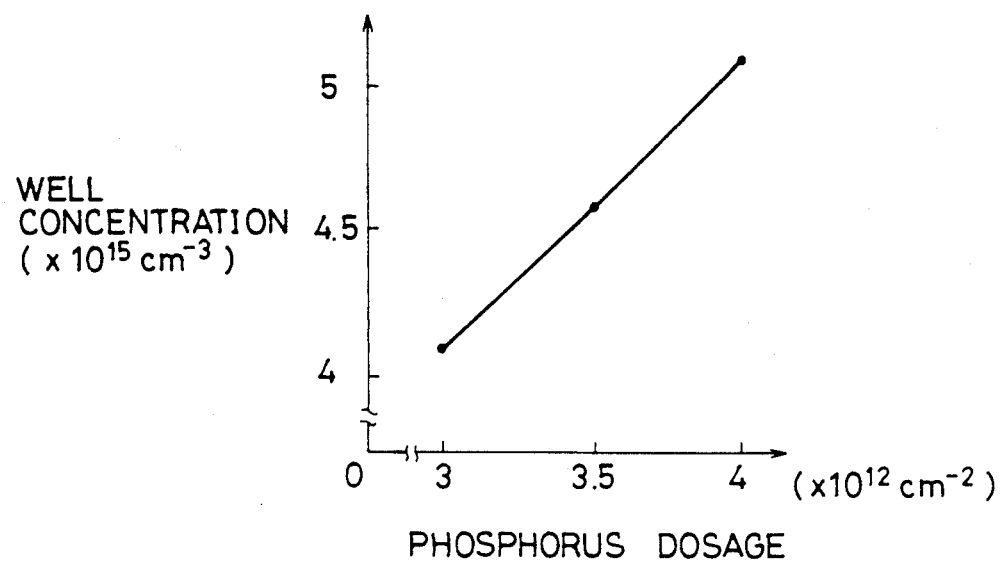
Figure 5E:
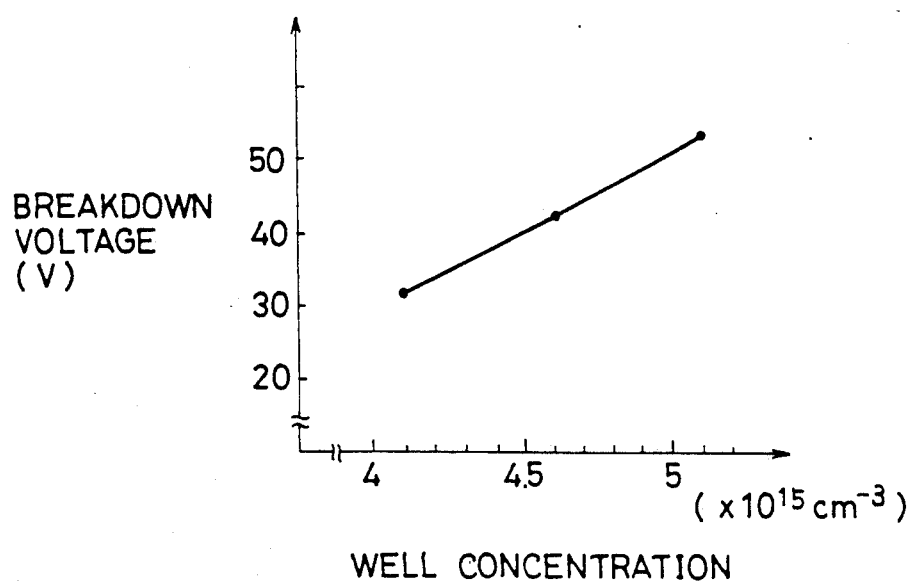

As shown in FIG. 5D, by increasing the phosphorus dosage, the impurity concentration of the formed well is increased. Referring to FIG. 5E, by increasing the well concentration, the drain breakdown voltage of the MOS transistor formed in that well can be increased.

Figure 6:
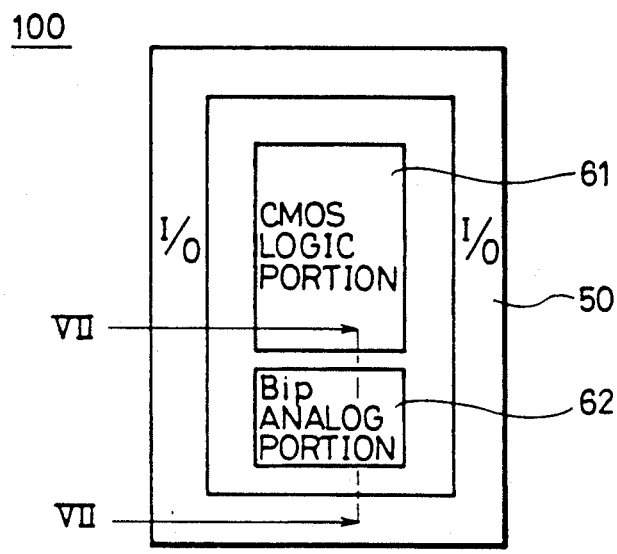
FIG. 6 is a block diagram showing an example of a whole structure of another semiconductor device to which the structure of the semiconductor device in accordance with the present invention is applied.
Figure 7:
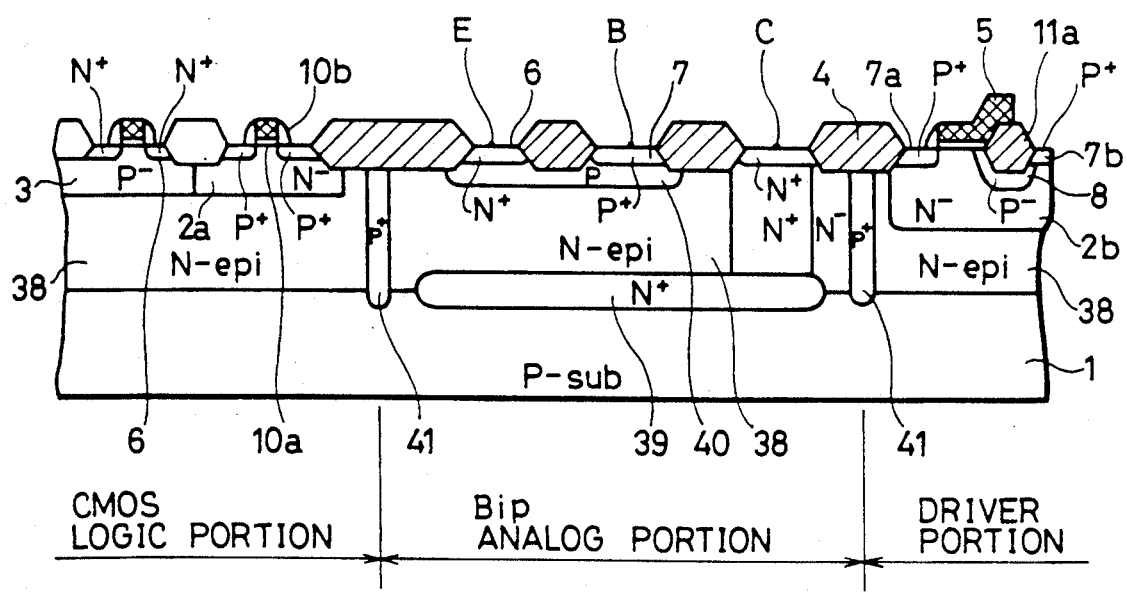
FIG. 7 is a partial cross sectional view showing a cross section taken along the line VII—VII of FIG. 6.

FIG. 6 is a block diagram showing, in a planar layout, one example of the entire structure of another semiconductor device comprising semiconductor regions having the same conductivity type and different junction depth in accordance with the present invention. FIG. 7 is a partial cross sectional view showing a cross section taken along the line VII—VII of FIG. 6.

Referring to FIG. 6, one chip constituting a microcomputer 100 comprises an I/O 50 serving as a driver portion at a peripheral portion, a CMOS logic portion 61 and a BiP analog portion 62 including bipolar transistor formed at the central portion. When the bipolar transistor is formed in the same chip as described above, it becomes possible to flow a larger current, compared with the chip constituted only by the MOS transistors. Referring to FIG. 7, an N type epitaxial layer 38 is formed on the main surface of the P type silicon substrate 1 and an N− buried layer 39 is formed below the region of the BiP analog portion 62. Oxide films 4 for isolation are formed at respective border regions between the CMOS logic portion 61, the BiP analog portion 62 and the driver portion, and P− buried layers 41 are formed therebelow.

A bipolar transistor comprising an N− impurity diffused region 6 connected to the emitter, a P− impurity diffused region 7 connected to the base and an N− impurity diffused region 6 connected to the collector is formed in the region of the BiP analog portion 62. A P type diffusion layer 40 is formed below the N− impurity diffused region 7 connected to the base, thereby providing an NPN type bipolar transistor. The CMOS logic portion 61 and the driver portion are formed on both sides of the region of the BiP analog portion 62.

In the region of the CMOS logic portion 61, a P type well layer 3 and an N type well layer 2a are formed in the N type epitaxial layer 38. An N channel type MOS transistor is formed in the region of the P type well layer 3 while a P channel type MOS transistor is formed in the region of the N type well layer 2a.

In the region of the driver portion, an N type well layer 2b is formed in the N type epitaxial layer 38. The junction depth of the N type well layer 2b is formed to be deeper than that of N type well layer 2a formed in the CMOS logic portion. A P channel type MOS transistor whose drain breakdown voltage is increased is formed in the region of the N type well layer 2b. The P channel type MOS transistor is constituted by a gate electrode 5 and a P+ impurity diffused region 7a serving as a source region and a P+ diffused region 7b serving as a drain region formed spaced apart from each other below the electrode. A thick gate insulating film 11a is formed on the side of the drain of the gate electrode 5 so as to increase the breakdown voltage.

As described above, the present invention may be applied to a single chip microcomputer which further comprises a BiP analog portion including a bipolar transistor. More specifically, the present invention may be applied to a single chip microcomputer on which a bipolar transistor which is superior in analog processing, high driving capability and high speed of operation and a CMOS logic portion in which elements of low power consumption are highly integrated are provided together.

Although a P type silicon substrate is used and a P channel type MOS transistor is formed by providing N type well layer in the driver portion in the foregoing, the same effect can be provided when an N type silicon substrate is used and an N channel type MOS transistor is formed by providing a P type well layer in the driver portion.

As described above, according to the present invention, semiconductor regions having the same conductivity type but different junction depths are formed in one semiconductor substrate, so that a semiconductor device capable of satisfying inconsistent demands of miniaturization and of increasing breakdown voltage can be provided.

A single chip microcomputer can be provided which comprises a miniaturized logic portion and a driver portion having an operational voltage which is high enough to be connected to a device which is operated at a high driving voltage.

A semiconductor device can be provided which comprises a miniaturized CMOS logic circuit and a MOS transistor having high drain breakdown voltage which operates at a high voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type having a main surface;
   a first semiconductor region of a second conductivity type which is opposite to that of said semiconductor substrate formed on the main surface of said semiconductor substrate in which at least a semiconductor element is to be formed; and
   a second semiconductor region of the second conductivity type formed on the main surface of said semiconductor substrate in which at least one semiconductor element is formed;
   wherein the at least one semiconductor element in the second semiconductor region includes an impurity region constituting an electrode thereof; and
   wherein the junction depth of only that portion of said second semiconductor region which is below said impurity region constituting an electrode is deeper than the junction depth of said first semiconductor region.

2. A semiconductor device according to claim 1 wherein said first semiconductor region contains at least one logic device and said second semiconductor region contains at least one driver device.

3. A semiconductor device according to claim 2, including an output connection from said second semiconductor region to a load.

4. A semiconductor device according to claim 3 wherein said load is a fluorescent display.

5. A semiconductor device according to claim 2, wherein said first and second semiconductor regions are adjacent each other in said substrate.

6. A semiconductor device according to claim 2, wherein said first and second semiconductor regions are spaced apart from each other by a third semiconductor region in said substrate.

7. A semiconductor device according to claim 2, including means for applying a first operational voltage to said first semiconductor region and for applying a second operational voltage greater than said first operational voltage to said second semiconductor region.

8. A semiconductor device according to claim 2, wherein the depth of said portion of said second semiconductor region is greater than that of said first semiconductor region by approximately 1.5 micrometers.

9. A semiconductor device according to claim 1, further comprising:
   a first field effect type semiconductor element formed in said first semiconductor region; and
   a second field effect type semiconductor element formed in said second semiconductor region.

10. A semiconductor device according to claim 9, wherein
    operational voltage of said second field effect type semiconductor element is higher than that of said first field effect type semiconductor element.

11. A semiconductor device according to claim 10, wherein
    said first field effect type semiconductor element comprises an impurity region of the first conductivity type formed in said first semiconductor region, and said second field effect type semiconductor element comprises an impurity region of the first conductivity type formed in said second semiconductor region.

12. A semiconductor device according to claim 11, wherein
    each of said first and second field effect type semiconductor elements, comprises an insulated gate, one electrode and an other electrode formed below said insulated gate spaced apart from each other on the main surface of said semiconductor substrate, said impurity region of the first conductivity type constituting said one electrode and said the other electrode, a channel region being formed in each of said first and second semiconductor regions of the second conductivity type between said one electrode and said the other electrode.

13. A semiconductor device comprising:
    a semiconductor substrate of a first conductivity type having a main surface;
    a first semiconductor region of a second conductivity type which is opposite to that of said semiconductor substrate formed on the main surface of said semiconductor substrate in which at least a first field effect type semiconductor element is formed, said first field effect type semiconductor element including an impurity region of the first conductivity type formed in said semiconductor region; and
    a second semiconductor region of the second conductivity type formed on the main surface of said semiconductor substrate in which at least a second field effect type semiconductor element is formed, said second field effect type semiconductor element including an impurity region of the first conductivity type formed in said second semiconductor region; wherein
    operational voltage of said second field effect type semiconductor element is higher than that of said first field effect type semiconductor element;
    each of said first and second field effect type semiconductor elements comprises an insulated gate, one electrode and an other electrode formed below said insulated gate spaced apart from each other on the main surface of said semiconductor substrate, said impurity region of the first conductivity type constituting said one electrode and said other electrode, a channel region being formed in each of said first and second semiconductor regions of the second conductivity type between said one electrode and said other electrode; and the junction depth of a portion of said second semiconductor region is deeper than the junction depth of said first semiconductor region below only said impurity region of the first conductivity type constituting said one electrode of said second field effect type semiconductor element.

14. A semiconductor device according to claim 13, further comprising a thick insulating film formed at least on the side of said one electrode below the gate of said second field effect type semiconductor element.

15. A semiconductor device according to claim 14, further comprising an impurity region of the first conductivity type formed below said thick insulating film.

16. A semiconductor device according to claim 9, wherein
said first semiconductor region constitutes a portion of a semiconductor region in which a complementary field effect type semiconductor element is formed.

17. A semiconductor device according to claim 16, wherein
said semiconductor device comprises a semiconductor region in which a bipolar type semiconductor element is formed.

18. A semiconductor device according to claim 1, wherein
said first semiconductor region and said second semiconductor region are formed adjacent to each other, said device further comprising an insulating film for isolation formed on the main surface of said semiconductor substrate at a border between said first semiconductor region and said second semiconductor region.

19. A large scale integrated circuit, comprising:
a semiconductor substrate of a first conductivity type;
a first well region of a second conductivity type which is opposite that of said first conductivity type, formed in said semiconductor substrate;
a least one logic device adapted to be operated by a first operating voltage being formed in said first well region;
a second well region of a second conductivity type different from said first well region and formed in said substrate;
at least one driver device adapted to be operated by a second operating voltage being formed in said second well region, said driver device including an electrode; and
an output connection for connecting said at least one driver device to an external load device; wherein
only that portion of said second well region below said electrode has a depth in said substrate greater than that of said first well region.

* * * * *